(12) United States Patent
Shanker et al.

(10) Patent No.: US 7,727,906 B1
(45) Date of Patent: Jun. 1, 2010

(54) H2-BASED PLASMA TREATMENT TO ELIMINATE WITHIN-BATCH AND BATCH-TO-BATCH ETCH DRIFT

(75) Inventors: Sunil Shanker, Sunnyvale, CA (US); Chi-I Lang, Sunnyvale, CA (US); Minh Anh Nguyen, San Jose, CA (US); Judy H. Huang, Los Gatos, CA (US)

(73) Assignee: Novellus Systems, Inc., San Jose, CA (US)

(*) Notice: Subject to any disclaimer, the term of this patent is extended or adjusted under 35 U.S.C. 154(b) by 800 days.

(21) Appl. No.: 11/493,679

(22) Filed: Jul. 26, 2006

(51) Int. Cl.
*H01L 21/31* (2006.01)

(52) U.S. Cl. ........................ 438/778; 134/1.1

(58) Field of Classification Search ............... 438/778, 438/424; 134/1.1
See application file for complete search history.

(56) References Cited

U.S. PATENT DOCUMENTS

| | | | |
|---|---|---|---|
| 5,788,778 A | 8/1998 | Shang et al. | |
| 6,305,390 B1 | 10/2001 | Jeon | |
| 6,449,521 B1 | 9/2002 | Gupta | |
| 6,534,007 B1 | 3/2003 | Blonigan et al. | |
| 6,544,345 B1 | 4/2003 | Mayer et al. | |
| 6,602,560 B2 | 8/2003 | Cheng et al. | |
| 6,716,765 B1 | 4/2004 | Hanprasopwattana et al. | |
| 6,843,858 B2 * | 1/2005 | Rossman | ..................... 134/30 |
| 6,848,455 B1 | 2/2005 | Shrinivasan et al. | |
| 6,867,086 B1 | 3/2005 | Chen et al. | |
| 6,872,323 B1 | 3/2005 | Entley et al. | |
| 7,344,996 B1 * | 3/2008 | Lang et al. | .................. 438/723 |

* cited by examiner

*Primary Examiner*—Bradley K Smith
(74) *Attorney, Agent, or Firm*—DeLio & Peterson, LLC; Kelly M. Nowak

(57) ABSTRACT

This invention relates to electronic device fabrication for making devices such as semiconductor wafers and resolves the detrimental fluorine loading effect on deposition in the reaction chamber of a HDP CVD apparatus used for forming dielectric layers in high aspect ratio, narrow width recessed features with a repeating dep/etch/dep process. The detrimental fluorine loading effect in the chamber on deposition uniformity is reduced and wafers are provided having less deposition thickness variations by employing the method using a passivation treatment and precoating of the chamber before substrates are processed. In a preferred process, after each wafer of a batch is finished, the passivation steps are repeated. In a further preferred process, after all the wafers of a batch are finished, the passivation and precoat procedure is repeated. A preferred passivation gas is a mixture of hydrogen and oxygen.

15 Claims, 2 Drawing Sheets

H2-BASED PLASMA TREATMENT TO ELIMINATE WITHIN-BATCH AND BATCH-TO-BATCH ETCH DRIFT

BACKGROUND OF THE INVENTION

This invention relates to electronic device fabrication processes. More specifically, the invention relates to resolving the detrimental fluorine loading effect on the deposition thickness drift on the device during the sequential processing of devices in the reaction chamber of a HDP CVD apparatus used for forming dielectric layers in high aspect ratio, narrow width recessed features.

It is often necessary in semiconductor processing to fill high aspect ratio gaps with insulating material. This is the case for shallow trench isolation, inter-metal dielectric layers, passivation layers, etc. As device geometries shrink and thermal budgets are reduced, void-free filling of high aspect ratio spaces (e.g., AR>3:1) becomes increasingly difficult due to limitations of existing deposition processes.

Most deposition methods deposit more material on the upper region than on the lower region of a sidewall and/or form top-hats at the entry of the gap. As a result the top part of a high aspect ratio structure sometimes closes prematurely leaving voids within the gap's lower portions. This problem is exacerbated in small features. Furthermore, as aspect ratios increase, the shape of the gap itself can contribute to the problem. High aspect ratio gaps often exhibit reentrant features, which make gap filling even more difficult. One such problematic reentrant feature is a narrowing at the top of the gap. The etched sidewalls slope inward near the top of the gap. For a given aspect ratio feature, this increases the ratio of gap volume to gap access area seen by the precursor species during deposition. Voids and seams formation is more likely under these conditions. If the top of the gap prematurely closes off, a chemical etch is required to re-open the gap before more film can be deposited in the gap.

High-density plasma chemical vapor deposition (HDP CVD) is a directional (bottom-up) CVD process that is used for high aspect ratio gap-fill. The method deposits more material at the bottom of a high aspect ratio structure than on its sidewalls. It accomplishes this by directing charged dielectric precursor species downward, to the bottom of the gap. Thus, HDP CVD is not an entirely diffusion-based (isotropic) process.

Nevertheless, some overhang or top-hat formation still results at the entry region of the gap to be filled. This results from the non-directional deposition reactions of neutral species in the plasma reactor and from sputtering/redeposition processes. The directional aspect of the deposition process produces some high momentum charged species that sputter away bottom fill. The sputtered material tends to redeposit on the sidewalls. Limitations due to overhang formation become ever more severe as the width of the gap to be filled decreases and the aspect ratio increases.

Conventional HDP CVD processes rely on plasma etch steps to remove sidewall deposits and top-hats. Typically a fluorine species, such as NF3, is used between dielectric film deposition steps to etch the film. After a layer of dielectric partially fills gaps on a substrate, the fluorine-containing plasma etches the layer to remove top-hats and open the gap for further deposition. However, these etch steps are time-consuming and expensive.

Current gap fill process uses multiple sequences of deposition and etch in a single chamber and this process methodology leaves behind residual fluorine which remains incorporated in trace amounts in the chamber, primarily the ceramic dome. These trace amounts accumulate with time and cause a detrimental fluorine loading effect resulting in a drift in the stack film thickness on the wafer in the process chamber as multiple wafers are sequentially processed. The loading effect is mainly caused by fluorine attacking the chamber environment and increases the batch thickness drift as more wafers are produced.

To improve fabrication of advanced technology devices, the art requires better dielectric deposition and etch processes that can fill high aspect ratio features of narrow width and reduce sidewall and top-hat formation without the detrimental fluorine loading effects on drift in the thickness of the deposition as the fabrication processes proceed.

SUMMARY OF THE INVENTION

Bearing in mind the problems and deficiencies of the prior art, it is therefore an object of the present invention to provide a method for filling gaps on a semiconductor substrate using a deposition/etch/deposition sequential process performed in a single chamber wherein the fluorine loading effect in the chamber on the deposition thickness is minimized and wafers are provided having less deposition thickness variations. The described process provides a chamber pre-treatment process including a looped treatment process used in the chamber between wafers being sequentially processed.

Still other objects and advantages of the invention will in part be obvious and will in part be apparent from the specification.

The above and other objects, which will be apparent to those skilled in the art, are achieved in the present invention which is directed to a method, and, in particular, a deposition/etch/deposition repeating method for filling gaps in a semiconductor substrate comprising:

providing a high density plasma chemical vapor deposition reaction chamber;

introducing one or more of a reducing gas such as hydrogen and one or more of an oxidizing gas such as oxygen into the reaction chamber;

forming a plasma and maintaining the plasma for a sufficient time to treat the chamber;

heating the treated chamber for a sufficient time to pre-heat the treated chamber;

optionally introducing one or more of a reducing gas such as hydrogen and one or more of an oxidizing gas such as oxygen into the reaction chamber;

optionally forming a plasma and maintaining the plasma for a sufficient time to treat the chamber;

introducing a dielectric process gas into the chamber;

depositing a dielectric precoat in the chamber using a HDP CVD process;

introducing one or more of a reducing gas such as hydrogen and one or more of an oxidizing gas such as oxygen into the reaction chamber;

forming a plasma and maintaining the plasma for a sufficient time to treat the chamber;

providing a semiconductor substrate having a gap to be filled in the precoated high density plasma chemical vapor deposition (HDP CVD) reaction chamber;

heating the substrate;

introducing a dielectric process gas into the chamber;

depositing a dielectric in the gap using a HDP CVD process;

introducing an etchant into the reaction chamber if an etch is required and forming an etchant plasma to etch the gap;

repeating the above deposition and etch steps until the gap is filled, introducing one or more of a reducing gas such as hydrogen and one or more of an oxidizing gas such as oxygen into the reaction chamber;

forming a plasma and maintaining the plasma for a sufficient time to treat the chamber; and removing the gap filled semiconductor substrate from the reaction chamber; and repeating the above steps except for the dielectric precoat deposition step until all the substrates for a predetermined number of substrates (batch) have been processed.

In another aspect of the invention directed to a method of making semiconductor substrates, after the desired predetermined number of substrates are processed, a new batch of substrates are processed using the same method resulting in a decrease in the batch-to-batch deposition thickness variation.

In preferred embodiments, the gas comprises hydrogen as a reducing gas and oxygen as an oxidizing gas. Treatment times range from between about 0.1 to 5 minutes per treatment and have a hydrogen (reducing gas) to oxygen (oxidizing gas) volume ratio of about 20:1 to 1:1. According to various embodiments a LF/MF source power of e.g., 2000-13000 W is typically used during the hydrogen/oxygen treatment.

In the precoat process the chamber is heated for about 0.1 to 5 minutes at 100 to 500° C., preferably with a He—$O_2$ plasma.

The methods of this invention may be used to fill high aspect ratio gaps, including gaps having aspect ratios ranging from 3:1 to 10:1.

In a further aspect of the invention, a method is provided for pre-treating a high density plasma chemical vapor deposition reaction chamber comprising:

providing a high density plasma chemical vapor deposition reaction chamber;

introducing one or more of a reducing gas such as hydrogen and one or more of an oxidizing gas such as oxygen into the reaction chamber;

forming a plasma and maintaining the plasma for a sufficient time to treat the chamber;

heating the treated chamber for a sufficient time to pre-heat the treated chamber, preferably with a He/$O_2$ plasma;

optionally introducing one or more of a reducing gas such as hydrogen and one or more of an oxidizing gas such as oxygen into the reaction chamber;

optionally forming a plasma and maintaining the plasma for a sufficient time to treat the chamber;

introducing a dielectric gas into the chamber; and depositing a dielectric precoat in the chamber using a HDP CVD process.

DETAILED DESCRIPTION OF THE INVENTION

The present invention relates to chemical vapor deposition processes that can fill high aspect ratio (typically at least 3:1), narrow width gaps with significantly reduced thickness drift of the deposition layer on sequentially processed substrates. The deposition processes described involve pre-treating the reaction chamber before performing the deposition/etch/deposition steps used to fill gaps in semiconductor substrates. In a preferred embodiment, a looped passivation method is used after each wafer is treated and before the next wafer is to be treated. The method provides improved control of the process and uniformity of the deposited film.

Although the present invention is described below in the context of high density plasma chemical vapor deposition (HDP CVD) gap fill, the invention is not so limited and may be used with other dielectric film deposition techniques such as PECVD, SACVD, ALD, PDL and other such processes.

Most deposition methods either deposit more material on the upper region than on the lower region of a sidewall or form cusps (also called top-hats) at the entry of the gap. To remove sidewall and top-hat deposits and keep the gap open for further deposition, conventional HDP CVD processes typically use a multi-cycle deposition process-etch process. Each cycle includes a deposition step followed by an etch step. Typically, fluorine species are used in the etch step. These fluorine steps load the chamber with fluorine species, however, and detrimentally affect the uniformity of the thickness of the dielectric deposit as multiple substrates are sequentially processed.

The methods of the present invention provide improved gap-fill control and deposition uniformity within a batch of wafers and within batch-to-batch sets of wafers. A batch of wafers is defined as a predetermined number of wafers per batch.

Figure 1:
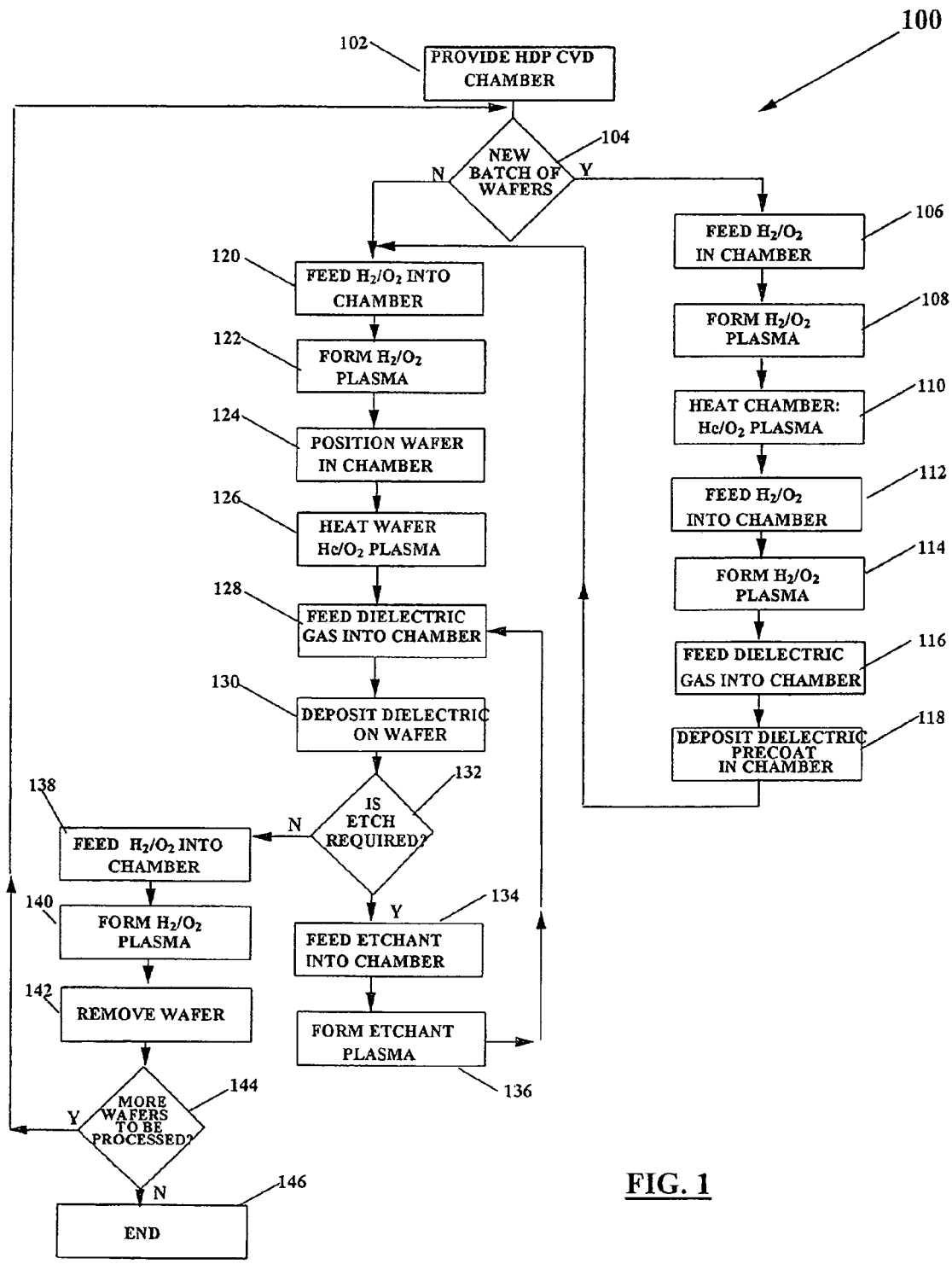
FIG. 1 is a process flow diagram depicting a preferred method of the invention.

FIG. 1 is a process flow sheet depicting a method according to one embodiment of the present invention.

The preferred embodiment of the invention is specifically directed to the use of a hydrogen/oxygen combination to passivate the chamber before wafers are processed in the chamber to gap fill the wafer and it will be appreciated by those skilled in the art that other type reducing and oxidizing passivation materials may be used in the method of the invention. Other gases include steam ($H_2O$) and hydrogen peroxide ($H_2O_2$). An inert gas such as He may be used with the combination.

The method of the invention is shown generally as numeral 100 and starts in step 102 wherein a HDP CVD chamber is provided to perform the steps for depositing a dielectric layer on the wafer and, in particular, to fill gaps in the wafer using a repeating deposition/etch/deposition process.

In the step 104 the process is queried to determine if a new batch of wafers is being processed or if a batch of wafers is continuing to be processed. In step 104, if a new batch of wafers is being processed, the chamber needs to be precoated.

A batch of wafers is defined as a predetermined number of wafers which is processed as a batch in the chamber. When that batch is treated, another batch will typically be processed in the chamber. Thus, the chamber is used to treat wafers by batches and it is an important aspect of this invention that the thickness variation of the dielectric deposition within batches and from batch-to-batch be controlled so that a uniform deposition is obtained within each batch and batch-to-batch.

It will be appreciated by those skilled in the art that the number of wafers in a batch may vary between two and fifty wafers although it has been found by the inventors to preferably be about four to twelve wafers per batch. After the batch is treated, it is desirable to form another dielectric precoat in the chamber using steps 106-118 before the next batch is processed. The wafer numbers per batch may vary widely and it is within the scope of the invention that a precoat may be deposited in the chamber whenever it is deemed important and/or the number of wafers per batch may be modified which will change the frequency of the formation of the dielectric precoat in the chamber as shown in the flow diagram.

In step 106 a hydrogen and oxygen mixture is fed into the chamber and is formed into a plasma in step 108. The plasma is maintained in the chamber for a sufficient time to treat the chamber and will typically be about 0.1 to 5 minutes, preferably about 0.5 to 2 minutes. The ratio of hydrogen to oxygen may vary widely and is typically in a volume ratio of hydrogen to oxygen of about 20 to 1, preferably 15 to 1. This is a first passivation step.

In step 110 the plasma treatment chamber is heated to further treat the chamber. The chamber is typically heated at a temperature of about 100 to 500° C., preferably 200 to 300° C. for about 0.1 to 5 minutes, preferably 0.5 to 2 minutes. A He/$O_2$ plasma is preferred for the heating.

In step 112 another mixture of hydrogen and oxygen is added into the chamber and formed into a plasma in step 114. This plasma is similar to the plasma of steps 106 and 108 and is used as a second passivation step in the chamber. This step is optional but preferred.

A dielectric gas is then fed into the chamber in step 116 and a dielectric precoat formed in the chamber in step 118 using a HDP CVD process.

Regardless of whether or not a precoat chamber was formed using steps 106-118 or if a number of wafers have already been processed in the previously precoated chamber, it is this point in the process that a wafer will be subjected to the deposition/etch/deposition process. In general, a deposition/etch process for filling gaps is preferably a deposition/etch/deposition process wherein the process starts and ends with a deposition step. This is preferred but it will be appreciated by those skilled in the art that the process can end with an etch step for certain situations. The flow diagram shown in FIG. 1 and as described hereinbelow will describe the preferred deposition/etch/deposition method which starts and ends with a deposition process.

Before a wafer is to be processed, a hydrogen and oxygen gas mixture is fed into the chamber in step 120. In step 122 a plasma is formed. A wafer is then positioned in the chamber in step 124 and the wafer heated in step 126. It is preferred to use a He/$O_2$ plasma to heat the wafer. A dielectric is then fed into the chamber in step 128 and a dielectric deposited on the wafer in step 130 using a HDP CVD process.

The process is then queried in step 132 to determine if an etch process is required. If an etch process is required, an etchant is fed into the chamber in step 134 and an etchant plasma formed in step 136. As noted above, in the preferred process in which the deposition process starts and ends with a deposition step the process is then recycled to steps 128 and 130 to deposit dielectric on the etched wafer.

When the dep/etch/dep method is completed, as determined by query step 132, and no further etch is required, hydrogen and oxygen are fed into the chamber in step 138. A plasma is formed in step 140 and then the wafer removed in step 142.

The process is then queried in step 144 to determine if more wafers are to be processed. If there are no more wafers to be processed the process ends in step 146. If more wafers are to be processed the process is recycled to query step 104 to determine if a new batch of wafers is to be processed or if the next wafer is from an existing batch of wafers.

The present invention is described as implemented in a HDP CVD reactor and is used to perform the repeating dep/etch/dep process in a single chamber. In the method of the invention, silicon oxide deposition and fluorine etching occur in one reactor. As is known in the art, the etch step may contain other gases such as hydrogen and inert gases and not pure etching gas such as F or $NF_3$. While in process, each wafer is held in place by a pedestal, wafer chuck and/or other wafer holding apparatus. For certain operations in which the wafer is to be heated, the apparatus may include a heater such as a heating plate. An example of a suitable reactor is the Speed™ reactor, available from Novellus Systems of San Jose, Calif.

Figure 2:
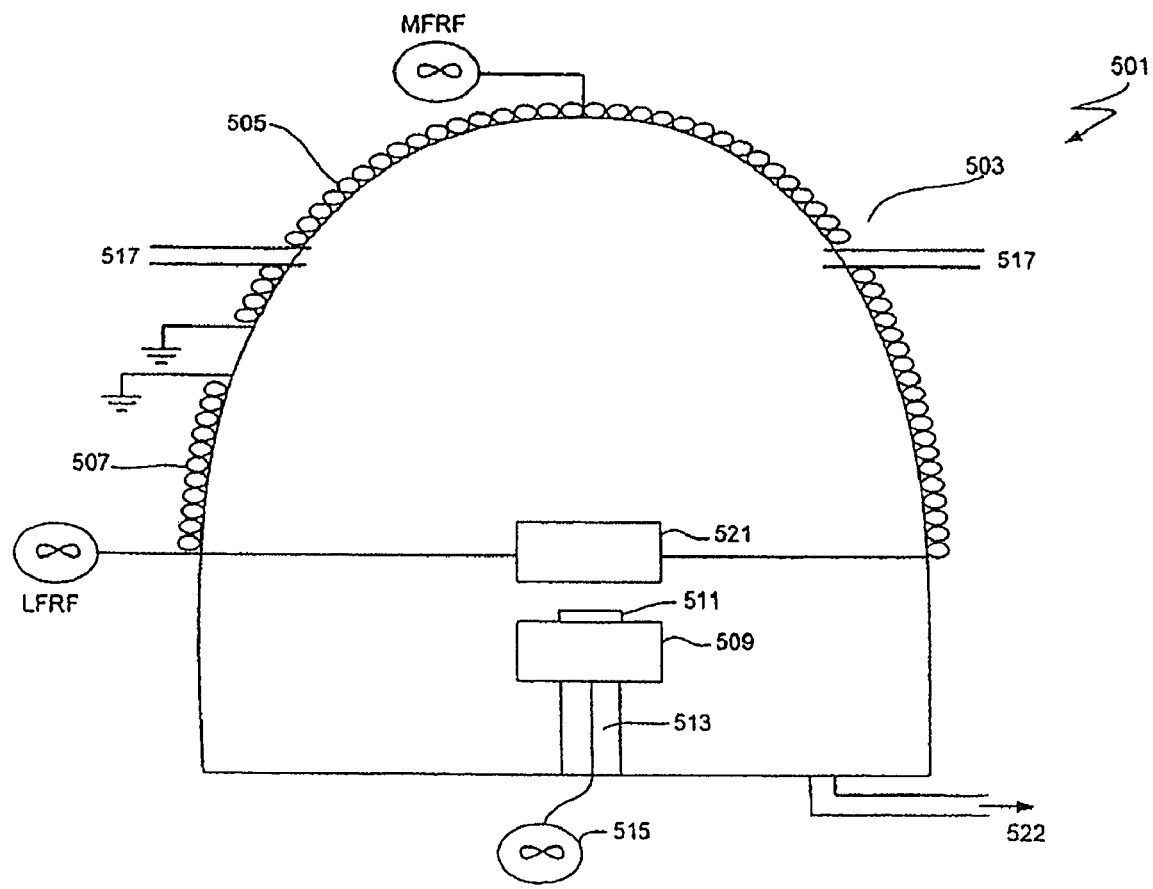
FIG. 2 is a block diagram depicting some components of a suitable CVD reactor for performing HDP CVD in accordance with this invention.

FIG. 2 provides a simple block diagram depicting various reactor components arranged as may be arranged in a conventional reactor. As shown, a reactor 501 includes a process chamber 503 which encloses other components of the reactor and serves to contain the plasma. In one example, the process chamber walls are made from aluminum, aluminum oxide, and/or other suitable material. The embodiment shown in FIG. 2 has two plasma sources: top RF coil 505 and side RF coil 507. Top RF coil 505 is a medium frequency or MFRF coil and side RF coil 507 is a low frequency or LFRF coil. In the embodiment shown in FIG. 2, MFRF frequency may be from 430-470 kHz and LFRF frequency from 340-370 kHz. However, the invention is not limited to operation in reaction chambers with dual sources, nor RF plasma sources. Another example may be a single plasma source that covers the top and side of the process chamber. Any suitable plasma source or sources may be used.

Within the reactor, a wafer pedestal 509 supports a substrate 511. The pedestal typically includes a chuck (sometimes referred to as a clamp) to hold the substrate in place during the deposition reaction. The chuck may be an electrostatic chuck, a mechanical chuck or various other types of chuck as are available for use in the industry and/or research. A heat transfer subsystem including a line 513 for supplying heat transfer fluid controls the temperature of substrate 511. The wafer chuck and heat transfer fluid system can facilitate maintaining the appropriate wafer temperatures.

A high frequency RF of HFRF source 515 serves to electrically bias substrate 511 and draw charged precursor species onto the substrate for the deposition reaction. Electrical energy from source 515 is coupled to substrate 511 via an electrode or capacitive coupling, for example. Note that the bias applied to the substrate need not be an RF bias. Other frequencies and DC bias may be used as well.

The process gases are introduced via one or more inlets 517. The gases may be premixed or not. Preferably, the process gas is introduced through a gas supply inlet mechanism including orifices. In some embodiments, at least some of the orifices orient the process gas along an axis of injection intersecting an exposed surface of the substrate at an acute angle. Further, the gas or gas mixtures may be introduced from a primary gas ring 521, which may or may not direct the gases toward the substrate surface. Injectors may be connected to the primary gas ring 521 to direct at least some of the gases or gas mixtures into the chamber and toward substrate. Note that injectors, gas rings or other mechanisms for directing process gas toward the wafer are not critical to this invention. The sonic front caused by a process gas entering the chamber will itself cause the gas to rapidly disperse in all directions—including toward the substrate. Process gases exit chamber 503 via an outlet 522. A vacuum pump (e.g., a turbomolecular pump) typically draws process gases out and maintains a suitably low pressure within the reactor.

For the passivation steps of the invention, reducing and oxidizing plasma may be generated by a remote plasma generator. The reactive species generated from the plasma may be conveyed to chamber 503 through a feed tube. The materials used to contain the plasma and feed tube must be resistant to attacks by the plasma and the feed tube should be kept as short as practical. Generating the plasma in a remote chamber does not subject the deposition chamber components to the temperature, radiation, or bombardment of a plasma formed in situ and has operating advantages which are apparent to those skilled in the art.

Passivation Treatment Parameters

Gas

In a preferred embodiment, hydrogen and oxygen gas is introduced to the reactor to create the plasma-containing hydrogen and oxygen gas and comprises substantially molecular hydrogen and molecular oxygen. In other embodiments, the gas may comprise a combination of hydrogen, oxygen, steam ($H_2O$), hydrogen peroxide ($H_2O_2$), among others. He or other inert gas may be used as a diluent.

Flow Rate

The hydrogen and oxygen gas in the desired ratio may be introduced to the chamber at any suitable flow rate. In a preferred embodiment for both 200 and 300 mm wafers, the flow rates of hydrogen ranges between about 100 sccm and 2000 sccm while the flow rate of oxygen varies between 50 sccm and 500 sccm. In a particularly preferred embodiment, the flow rate of hydrogen is about 1500 sccm, while the flow rate of oxygen is about 100 sccm. The volume ratio of $H_2/O_2$ is about 20 to 1, preferably 15 to 1.

Passivation Plasma Source Power

The passivation plasma source power should be high enough to sustain a plasma and low enough so that the effect of the $H^+$ or $O^-$ ions do not overwhelm that of the $H_2$ and $O_2$ radicals. Note that preferred RF power will depend on the substrate size (e.g., 200 or 300 mm diameter wafer) and the requirements of the specific process being used. In a preferred embodiment using the dual RF plasma source described above for both 200 and 300 mm, the power of each of the LFRF and MFRF plasma sources should be between 2000 W and 7500 W. In a particularly preferred embodiment, the power of each source is 3000 W.

Temperature and Pressure

Substrate temperature and chamber pressure during the passivation treatment are generally within the ranges commonly used during HDP CVD processes. Temperature values may range from about 200° C. and 1,000° C. A preferred range during passivation treatment is between about 400° C. and 550° C. and a particularly preferred range is between about 480° C. and 500° C. Pressure is preferably maintained at a value below 500 mTorr, more preferably between about 5 and 500 mTorr.

Time

Passivation treatment time should be long enough to achieve a stable plasma within the reactor. Note that preferred treatment time will depend on the substrate size (e.g., 200 or 300 mm diameter wafer) and the requirements of the specific process being used. In a preferred embodiment, the substrate is exposed to the passivation plasma mixture for a time ranging from about 0.1 to 5 minutes. In a particularly preferred embodiment, the substrate is exposed to the hydrogen and oxygen plasma for a time ranging from about 0.5 to 2 minutes.

Post Passivation Chamber Heating

The passivated chamber is heated by heating the chamber to a temperature of 100 to 500° C., preferably 200 to 300° C., and maintaining this temperature for 0.1 to 5 minutes, preferably 0.5 to 2 minutes. The chamber at this point sustains a plasma discharge that may comprise helium, hydrogen, and/or oxygen. In a preferred embodiment, the flow rates for He are between 200 and 1000 sccm, while oxygen is between 50 and 500 sccm. The power of each of the LFRF and MFRF plasma sources should be between 2000 W and 7500 W. In a particularly preferred embodiment, the power of each source is 3000 W.

Substrate

The substrate may be any suitable substrate, typically a semiconductor wafer. Typical substrates are 200 mm or 300 mm silicon wafers. It should be noted that unless otherwise noted, process parameters given are specific to a 300 mm wafer, but one of skill in the art would understand how to adjust these parameters to process a 200 mm wafer.

In some embodiments, the substrate provided to the chamber is bare. For the purposes of this application, bare substrates are semiconductor substrates that do not contain heterogeneous layers of material on the semiconductor material. In some embodiments, the bare substrate may be a new substrate, i.e. a semiconductor substrate that has not undergone previous processing. In some embodiments, the bare substrate may be recycled, i.e., a semiconductor substrate that has been stripped and substantially cleaned of any material other than the semiconductor. In some embodiments, the semiconductor substrate may include a SiN liner layer but no dielectric material. In some embodiments, the substrate includes a dielectric/etch layer.

Deposition Parameters

Gas

The components of the process gas should be chosen to produce the composition of the dielectric to be deposited. As is known to those of skill in the art, many suitable precursor gases are widely available, some of which include both a source of silicon and oxygen. Examples of suitable silicon-containing precursor molecules include the following: silane ($SiH_4$), $Si_2H_6$, TES (Tri-Ethoxy Silane), TEOS (tetraethyl orthosilicate), TMCTS (tetramethyl-cyclotetrasiloxane), OMCTS (octamethyl-cyclotetrasiloxane), methyl-silane, dimethyl-silane, 3MS (trimethylsilane), 4MS (tetramethylsilane), TMDSO (tetramethyl-disiloxane), TMDDSO (tetramethyl-diethoxyl-disiloxane), DNDMS (dimethyl-dimethoxyl-silane) and mixtures thereof. During deposition, the process decomposes the silicon-containing reactant to form a silicon-containing gas and plasma phase species, which can react on the surface of the substrate.

Examples of suitable oxygen-containing precursor molecules include the following: oxygen, ozone, steam ($H_2O$), hydrogen peroxide ($H_2O_2$), nitric oxide (NO), and nitrous oxide ($N_2O$).

For doped dielectrics, the process gas may include a dopant precursor such as a boron-containing gas, a phosphorus-containing gas, or a mixture thereof.

Often, the process gas employed for deposition will also include a carrier gas such as helium or argon. Still other process gases such as nitrogen, ammonia, and lower hydrocarbons (such as methane, ethylene, and acetylene) may be employed depending on the composition of the dielectric to be deposited.

Flow Rate

Flow rate of the silicon-containing precursor gas typically ranges from about 40-200 sccm. As discussed above, in preferred embodiments, the flow rate is high to achieve a high deposition rate process. Thus, in a preferred embodiment the flow rate of the silicon-containing precursor gas is between about 80 and 200 sccm. For silane, a flow rate of about 100 sccm is particularly preferred.

Time

Deposition time will depend on the requirements of the specific process being used.

Temperature and Pressure

The temperature of the substrate within the process vessel should be maintained sufficiently high to ensure that the dielectric deposition reaction proceeds efficiently. Hence, the temperature preferably resides at values between about 200 and 1000° C. and more preferably between about 450 and 750° C. In particularly preferred embodiments, the substrate temperature is maintained between about 480 and 650° C. For deposition, the pressure within the reactor during HDP CVD is typically maintained at a level no greater than about 100 mTorr, more preferably between about 2 and 30 mTorr.

Plasma Source and Bias Power

The high frequency electrode (for biasing the substrate) preferably generates a power of between about 0 and 10 kilowatts during deposition. For many deposition reactions suitable for this invention, the total power of the LF and MF sources (i.e. MF+LF) ranges from 2 kW to 13 kW for both 200 and 300 mm system. The LF/MF power split is tuned to obtained good, uniform gap fill from center to edge.

Etchant Parameters

Gas

The gas is typically fluorine based and may be chosen from a wide variety of materials including $CF_4$, $SF_6$, or $NF_3$. Molecular oxygen and/or one or more of an inert carrier gas such as helium or argon may also be present in the etchant chemistry.

Flow Rate

The flow rate of the etchant gases may vary widely and is typically about 50 to 500 sccm.

Time

Etchant time will depend on the requirement of the specific process being used.

Temperature and Pressure

The temperature of the reactor should be maintained sufficiently high to ensure etchant process proceeds sufficiently. Typically, the temperature is about 100 to 1000° C., and preferably between about 300 to 500° C.

Plasma Source and Bias Power

Any conventional electrical subsystem may be used to generate a plasma and RF power and substrate bias and/or substrate bias may be used depending on the process to be performed.

EXAMPLES

The following examples are provided to illustrate certain aspects of the present invention. The examples will serve to further illustrate the invention but are not intended to limit the scope of the invention in any way.

Example 1

Batches of wafers (eight wafers per batch) were comparatively tested using (1) the method of the invention as shown in FIG. 1 and (2) a method of using a precoat of the process chamber but not including the passivation and heating steps 104-112. The wafers were treated with the same deposition steps and etchant steps and it was found that the method of the invention had a thickness drift of 133 Å compared to a thickness drift of 166 Å for the other process.

The results indicate that the method of the invention reduces stack and thickness drifts within a batch. Drift is defined as the difference between the minimum and maximum stack film thicknesses measured in a batch of wafers. Again, the method of the invention has a drift of 133 Å compared to 166 Å for the standard process.

In similar tests, the drift for the method of the invention was 181 Å compared with a drift of 272 Å for the other process. Similarly, a drift of 226 Å was obtained for the method of the invention versus 375 Å for the other method.

Example 2

The method of the invention was evaluated for the passivation chemistry and compared the preferred hydrogen/oxygen plasma with a helium/oxygen plasma. The wafers within the batch were treated identically except for the passivation chemistry.

The method using the helium/oxygen passivation chemistry had a batch-to-batch variation (eight wafers per batch) of an $R^2$ of 0.0944. This is to be compared with an identical process using a hydrogen/oxygen passivation chemistry wherein the $R^2$ was only 0.0129. This example shows that the method of the invention reduced within-batch drift and reduced batch-to-batch thickness drift compared to the helium/oxygen passivation chemistry. $R^2$ is widely used statistical measure of fit for regression models and is called Co-efficient of Determination. The value of $R^2$ varies between 0 and 1 (source: Business Statistics for Contemporary Decision Making, Ken Black, page 499, Fourth Edition).

Example 3

The method of the invention was used to process multiple batches of wafers and included a wet-wipe to the chamber before the start of the method of the invention. A total of 400 wafers were processed (50 batches). The results show very low to no thickness drift and a $R^2$ equal to 0.002.

While this invention has been described in terms of a few preferred embodiments, it should not be limited to the specifics presented above. Many variations on the above-described preferred embodiments, may be employed. Therefore, the invention should be broadly interpreted with reference to the following claims.

The invention claimed is:

1. A method for filling gaps in a semiconductor substrate comprising:

providing a high density plasma chemical vapor deposition reaction chamber;

introducing one or more of a reducing gas and one or more of an oxidizing gas into the reaction chamber;

forming a first plasma and maintaining the first plasma for a sufficient time to treat the chamber;

heating the treated chamber for a sufficient time to pre-heat the treated chamber;

introducing a dielectric process gas into the treated and heated chamber;

depositing a dielectric precoat in the treated and heated chamber using a HDP CVD process;

introducing additional of the one or more reducing gas and the one or more oxidizing gas into the reaction chamber prior to processing a substrate in the chamber;

forming a second plasma and maintaining the second plasma for a sufficient time to treat the chamber having the dielectric precoat;

providing a semiconductor substrate having a gap to be filled in the treated and precoated high density plasma chemical vapor deposition (HDP CVD) reaction chamber;

heating the substrate;

introducing a dielectric process gas into the chamber;

depositing a dielectric in the gap using a HDP CVD process;

introducing an etchant into the reaction chamber if an etch is required and forming an etchant plasma to etch the gap;

repeating the above deposition and etch steps until the gap is filled;

determining completion of the deposition and etch steps of the semiconductor substrate;

once the deposition and etch steps are complete, introducing one or more of a reducing gas and one or more of an oxidizing gas into the reaction chamber;

forming a plasma and maintaining the plasma for a sufficient time to treat the chamber;

removing the gap filled semiconductor substrate from the reaction chamber; and repeating the above steps except for the dielectric precoat deposition step until all the substrates for a predetermined number of substrates (batch) have been processed whereby fluorine loading effects in the chamber on the dielectric deposition uniformity is reduced and the substrates have decreased deposition thickness variations.

2. The method of claim 1 further including steps of introducing additional reducing and oxidizing gas or gases into the reaction chamber and forming additional plasma to treat the previously treated and heated chamber.

3. The method of claim 1 wherein the reducing gas is hydrogen and the oxidizing gas is oxygen.

4. The method of claim 3 wherein the plasma is maintained for a time of about 0.1-5 minutes.

5. The method of claim 4 wherein the hydrogen to oxygen volume ratio is about 20:1 to 1:1.

6. The method of claim 1 wherein a source power of about 200-13000 W. is used during the plasma treatment.

7. The method of claim 1 wherein the chamber is heated for about 0.1-to 5 minutes at about 100-500° C.

8. The method of claim 1 wherein after a number of substrates have been processed for the batch, the method is repeated including the step to precoat of the chamber for the first wafer of a new batch of wafers.

9. A method for pre-treating a high density plasma chemical vapor deposition reaction chamber comprising:

providing a high density plasma chemical vapor deposition reaction chamber;

introducing one or more of a reducing gas and one or more of an oxidizing gas into the reaction chamber;

forming a first plasma and maintaining the first plasma for a sufficient time to treat the chamber;

heating the treated chamber for a sufficient time to pre-heat the treated chamber;

introducing a dielectric process gas into the treated and pre-heated chamber;

depositing a dielectric precoat in the treated and pre-heated chamber using a HDP CVD process;

introducing additional of both the one or more reducing gas and the one or more oxidizing gas into the reaction chamber;

forming a second plasma and maintaining the second plasma for a sufficient time to treat the chamber having the dielectric precoat prior to processing a substrate in the chamber.

10. The method of claim 9 further including—steps of introducing additional gases into the reaction chamber and forming additional plasma to treat the previously treated and heated chamber.

11. The method of claim 10 wherein the reducing gas is hydrogen and the oxidizing gas is oxygen.

12. The method of claim 9 wherein the plasma is maintained for a time of about 0.1-5 minutes.

13. The method of claim 12 wherein the hydrogen to oxygen volume ratio is about 20:1 to 1:1.

14. The method of claim 9 wherein a source power of about 200-13000 W. is used during the plasma treatment.

15. The method of claim 9 wherein the chamber is heat treated for about 0.1-to 5 minutes at about 100-500° C.

* * * * *